(12) United States Patent
Li et al.

(10) Patent No.: US 11,522,144 B2
(45) Date of Patent: Dec. 6, 2022

(54) STRETCH DISPLAY DEVICE AND PREPARATION METHOD

(71) Applicant: BOE TECHNOLOGY GROUP CO., LTD., Beijing (CN)

(72) Inventors: Xiaohu Li, Beijing (CN); Jinxiang Xue, Beijing (CN); Zhiqiang Jiao, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 16/763,966

(22) PCT Filed: Dec. 23, 2019

(86) PCT No.: PCT/CN2019/127412
§ 371 (c)(1),
(2) Date: May 13, 2020

(87) PCT Pub. No.: WO2020/155927
PCT Pub. Date: Aug. 6, 2020

(65) Prior Publication Data
US 2021/0376266 A1    Dec. 2, 2021

(30) Foreign Application Priority Data

Jan. 28, 2019  (CN) .......................... 201910081358.4

(51) Int. Cl.
*H01L 51/00*     (2006.01)
*H01L 27/32*     (2006.01)
*H01L 51/52*     (2006.01)

(52) U.S. Cl.
CPC ...... *H01L 51/0097* (2013.01); *H01L 27/3246* (2013.01); *H01L 51/0026* (2013.01);
(Continued)

(58) Field of Classification Search
CPC ............... H01L 51/5253; H01L 51/006; H01L 51/0097; H01L 27/3246; H01L 27/32;
(Continued)

(56) References Cited

U.S. PATENT DOCUMENTS

| 2012/0020732 A1* | 1/2012 | Stiles | ...................... E02B 15/06 405/63 |
| 2013/0248867 A1* | 9/2013 | Kim | .................... H01L 27/3246 438/34 |

(Continued)

FOREIGN PATENT DOCUMENTS

| CN | 108666347 A | 10/2018 |
| CN | 108666353 A | 10/2018 |

OTHER PUBLICATIONS

ISA National Intellectual Property Administration of the People's Republic of China, International Search Report Issued in Application No. PCT/CN2019/127412, dated Mar. 27, 2020, 2 pages.
(Continued)

*Primary Examiner* — Vongsavanh Sengdara
(74) *Attorney, Agent, or Firm* — McCoy Russell LLP

(57) ABSTRACT

The present disclosure discloses a stretch display device and a preparation method. The method includes providing a substrate on which a flexible substrate is disposed, and a film layer constituting a thin film transistor disposed on a side of the flexible substrate away from the substrate, the film layer being away from the flexible substrate. One side defines a plurality of pixel regions; a hollow portion is formed between adjacent two of the pixel regions, the hollow portion penetrates through the film layer and the flexible substrate; and thermal separation is provided in the hollow portion via a gel; a light-emitting element is disposed in the pixel region, and an encapsulating film layer is disposed on a side of the light-emitting element and the thermal separation gel away from the flexible substrate; heating the thermal
(Continued)

separation gel, and the flexible liner. The bottom and the substrate are peeled off. Therefore, when the substrate is peeled off by this method, the problem of breakage of the flexible substrate and the film layer constituting the thin film transistor can be alleviated, and the production yield of the stretch display device can be remarkably improved.

13 Claims, 4 Drawing Sheets

(52) U.S. Cl.
CPC ...... *H01L 51/5253* (2013.01); *H01L 27/3258* (2013.01); *H01L 2251/558* (2013.01)

(58) Field of Classification Search
CPC ......... H01L 27/3258; H01L 2251/5338; H01L 2251/558
See application file for complete search history.

(56) References Cited

U.S. PATENT DOCUMENTS

2016/0028043 A1\* 1/2016 Kwon ................. H01L 51/5253
257/40
2018/0052493 A1\* 2/2018 Hong ................. H01L 51/0097

OTHER PUBLICATIONS

State Intellectual Property Office of the People's Republic of China, Office Action and Search Report Issued in Application No. 201910081358.4, dated Jun. 12, 2020, 13 pages. (Submitted with Partial Translation).

\* cited by examiner

STRETCH DISPLAY DEVICE AND PREPARATION METHOD

CROSS-REFERENCE TO RELATED APPLICATIONS

The present application is a U.S. National Phase of International Application No. PCT/CN2019/127412 entitled STRETCH DISPLAY DEVICE AND PREPARATION METHOD and filed on Dec. 23, 2019. International Application No. PCT/CN2019/127412 claims priority to Chinese Patent Application No. 201910081358.4, filed on Mar. 22, 2019. The entire contents of each of the above-listed applications are incorporated herein by reference.

TECHNICAL FIELD

The present disclosure relates to display technology, and in particular to a stretch display device and a method of fabricating the same.

BACKGROUND/SUMMARY

With the continuous development of display technology, people pay more and more attention to stretch display devices. In addition to being able to withstand bending, folding, and rolling, the stretch display device can withstand pressure and stretch, and has a high application prospect in the fields of wearable display, skin display, Internet of things devices, automobiles, and artificial intelligence.

However, current stretch display devices and preparation methods still need to be improved.

The present disclosure is based on the discovery and recognition of the following facts and problems by the inventors:

Currently, stretch display devices may have a low production yield due to current manufacturing methods. The inventors have conducted intensive research and a large number of experiments and found that this may be due to the fact that in the process of preparing the stretch display device, the flexible substrate and other film layers are easily degraded (e.g., bent, cracked, etc.) when the glass substrate is peeled off. Specifically, in the preparation of the stretch display device, each film layer of the stretch display device may be formed on a glass substrate, and finally the glass substrate is peeled off to obtain a stretch display device. A flexible substrate and a film layer for constituting a thin film transistor are sequentially disposed on the glass substrate, and a film region for constituting the film layer of the thin film transistor from the flexible substrate is defined, and a hollow region is disposed between the adjacent two pixel regions. The hollow portion penetrates through the film layer for forming the thin film transistor and the flexible substrate, and the provision of the hollow portion facilitates the realization of the stretch display, the pixel region is provided with the light-emitting element, and the light-emitting element and the hollow portion are covered by the encapsulating film layer. That is, the encapsulating film layer covering the hollow portion is in contact with the glass substrate. The adhesion between the encapsulating film layer of the hollow portion and the glass substrate is large. When the glass substrate is subsequently peeled off, the encapsulating film layer of the hollow portion is difficult to separate from the glass substrate, and the hollow portion may be degraded by the external mechanical pulling force. The film layer in which the encapsulating film layer is in contact, such as a flexible substrate, and the film layer constituting the thin film transistor, may be degraded, resulting in low production yield and increased manufacturing costs.

The present disclosure is directed to at least alleviating or solving at least one of the above mentioned problems.

In one aspect of the disclosure, the disclosure provides a method of manufacturing a stretch display device. The method includes providing a substrate on which a flexible substrate is disposed, and a film layer constituting a thin film transistor disposed on a side of the flexible substrate away from the substrate. In one embodiment, a side of the film layer faces away from the flexible substrate. One side of the film layer distal to the flexible substrate (e.g., the side not physically coupled to the flexible substrate and facing away from the flexible substrate) defines a plurality of pixel regions, wherein a hollow portion of a plurality of hollow portions is formed between two adjacent pixel regions, the hollow portion penetrates through the film layer and the flexible substrate. The thermal separation is provided in the hollow portion via a thermal separation material. A light-emitting element is disposed in the pixel region and spaced away from the thermal separation material, and an encapsulating film layer is disposed on a side of the light-emitting element and the thermal separation material away from the flexible substrate. The encapsulating film layer is blocked from contacting the flexible substrate and the substrate via the thermal separation material. Following heating of the thermal separation material, a portion of the encapsulating film layer physically coupled to the thermal separation material, and the substrate are peeled off. Therefore, when the substrate is peeled off by this method, the issue of breakage of the flexible substrate and the film layer constituting the thin film transistor can be alleviated, and the production yield of the stretch display device can be remarkably improved.

According to an embodiment of the present disclosure, after the hollow portion is formed between two adjacent pixel regions, and before the thermal separation material is disposed in the hollow portion, the method further includes providing a side of the film layer distal to the flexible substrate with a pixel defining structure, the pixel defining structure defining a plurality of the pixel regions; and a package partition wall is disposed on a side of the pixel defining structure adjacent to the hollow portion. Thus, the pixel defining structure can be used to separate a plurality of light emitting elements to prevent cross-coloring, and the package partition wall can be used to block the encapsulating film layer covering the thermal separation material from the encapsulating film layer covering the light emitting elements.

According to an embodiment of the disclosure, the thermal separation material is away from and increases in width from a surface of the substrate facing the hollow portion and is flush with a side of the film layer remote from the substrate facing the hollow portion. Thereby, the encapsulating film layer of the hollow portion can be prevented from contacting the substrate, facilitating the peeling of the flexible substrate, alleviating the problem of the flexible substrate and the film layer forming the thin film transistor, improving the production yield, and facilitating the encapsulating film layer of the hollow portion. Disconnection of the encapsulating film layer from the rest of the area to facilitate removal of the thermal separation material.

According to an embodiment of the disclosure, the thermal separation material is remote from one side of the substrate, above the film layer and below the package partition wall. Thereby, the encapsulating film layer of the hollow portion can be prevented from contacting the substrate, facilitating the peeling of the substrate, alleviating the problem of the flexible substrate and the film layer forming the thin film transistor degrading due to mechanical tension, improving the production yield, and facilitating the removal of the encapsulating film layer of the hollow portion corresponding to the thermal separation material from the rest of the encapsulating film layer that will remain with the stretch display device.

According to an embodiment of the present disclosure, the film layer includes a plurality of sub-layers including a buffer layer, a gate insulating layer, an interlayer dielectric layer, and an insulating layer which are sequentially stacked, wherein the buffer layer is disposed adjacent to the flexible substrate, followed by the gate insulating layer, the interlayer dielectric layer, and the insulating layer. Each of the layers of the film layer may be in face-sharing contact with an adjacent layer. For example, the buffer layer is in face-sharing contact with the flexible substrate and the gate insulating layer. The interlayer dielectric layer is in face-sharing contact with the gate insulating layer and the insulating layer. Thus, when the thermal separation material is flush with the film layer constituting the thin film transistor and each of its plurality of sub-layers, or when the thermal separation material is higher than the film layer for forming the thin film transistor and lower than the package partition wall. In one example, the thermal separation material may be used according to the thin film transistor for forming, wherein the specific structure of the film determines the thickness of the thermal separation material.

According to an embodiment of the disclosure, the thermal separation material has a thickness of from 1 to 50 μm, wherein the thickness of the thermal separation material increases in a direction away from the substrate. Thus, by providing the thermal separation material in the hollow portion, when the substrate is subsequently peeled off following heating of the thermal separation material, the issue described above of the flexible substrate and the film layer constituting the thin film transistor contacting the encapsulating film layer can be alleviated, and the production yield can be improved.

According to an embodiment of the disclosure, the manner in which the thermal separation material is disposed includes at least one of printing and coating. Thereby, the setting of the thermal separation material can be achieved in a simple manner that is easy to manufacture and reduces manufacturing costs.

According to an embodiment of the disclosure, the temperature of the thermal separation material is heated to 60-120° C. The above temperature range facilitates separation of the thermal separation material from the encapsulating film layer covering the thermal separation material and the substrate, while the above temperature range does not affect the performance of the light-emitting element.

According to an embodiment of the present disclosure, the thermal separation material comprises at least one of azodicarbonamide, diazoaminobenzene, and p-toluenesulfonylhydrazide. The above materials can generate nitrogen under heating conditions within a desired temperature range, thereby facilitating separation of the thermal separation material from the encapsulating film layer covering the thermal separation material and the substrate.

According to an embodiment of the present disclosure, after the thermal separation material is heated, before the substrate is peeled off, the method further includes removing the thermal separation material and covering the encapsulating film layer of the thermal separation material. Thereby, the thermal separation material can be removed first and then the substrate can be peeled off, thereby alleviating the problem of the flexible substrate and the film layer constituting the thin film transistor, and improving the production yield.

According to an embodiment of the present disclosure, after the substrate is peeled off, the method further includes removing the thermal separation material and covering the encapsulating film layer of the thermal separation material. Thereby, the substrate can be peeled off and the thermal separation material can be removed, and the problem of the flexible substrate and the film layer for forming the thin film transistor can be alleviated, and the production yield can be improved.

According to an embodiment of the disclosure, removing the thermal separation material and a portion of the encapsulating film layer physically coupled to only the thermal separation material comprises heating the thermal separation material and removing the thermal separation material and the portion of the encapsulating film layer without removing the remaining regions of the encapsulating film layer. The encapsulating film layer is broken (e.g., discontinuous) in the region of the hollow portion; the flexible substrate provided with the thermal separation material is inverted to take out the thermal separation material. Thereby, the encapsulating film layer covering the thermal separation material and the thermal separation material can be removed by a simple method.

In another aspect of the disclosure, the disclosure provides a stretch display device. According to an embodiment of the present disclosure, the stretch display device is prepared according to the method described above, whereby the stretch display device has all the features and advantages of the stretch display device prepared by the method described above. The stretch display device has a higher production yield via the method described above compared to other stretch display devices manufactured via different methods illustrated in previous examples.

In another aspect of the disclosure, the disclosure provides a stretch display device. According to an embodiment of the present disclosure, the stretch display device includes a flexible substrate which is sequentially stacked, a film layer for constituting a thin film transistor, a light emitting element, and a package film layer, wherein between the two adjacent light emitting elements there is a hollow portion that penetrates the film layer and the flexible substrate, and the encapsulating film layer covers the light-emitting element without covering the hollow portion. This arrangement provides the stretch display device with a high production yield.

BRIEF DESCRIPTION OF THE DRAWINGS

The above and/or additional aspects and advantages of the present disclosure will become apparent and readily understood from.

DETAILED DESCRIPTION

Figure 1:
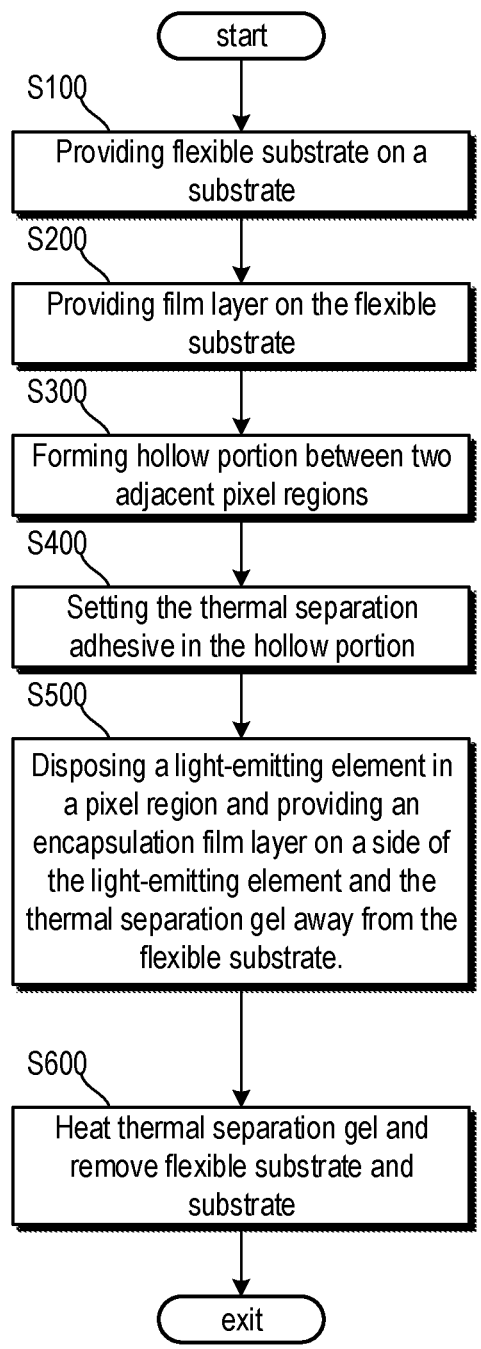
FIG. 1 shows a schematic flow chart of a method of preparing a stretch display device according to an embodiment of the present disclosure.

The embodiments of the present disclosure are described in detail below, and the examples of the embodiments are illustrated in the drawings, wherein the same or similar reference numerals are used to refer to the same or similar elements or elements having the same or similar functions. The embodiments described below with reference to the accompanying drawings are intended to be illustrative of the disclosure and are not to be construed as limiting.

In one aspect of the disclosure, the disclosure provides a method of manufacturing a stretch display device. As described above, in the previous examples, in the process of preparing a stretch display device, it is desired to be performed on a rigid substrate, and after the preparation is completed, the flexible display device is peeled off from the rigid substrate (glass substrate). Specifically, referring to FIG. 2, after the stretch display device is prepared on the substrate 100, the substrate 100 and the flexible substrate 200 are separated to form the stretch display device. The encapsulating film layer 500 covers the film layer 300 and the flexible substrate 200 for forming the thin film transistor. The hollow portion 10 of the flexible substrate 200, that is, the encapsulating film layer 500 covering the hollow portion 10 is in contact with the substrate 100, and the adhesion between the two is large, and when the substrate 100 is peeled off, the encapsulating film layer 500 covering the hollow portion 10 is removed. The encapsulating film layer 500 is difficult to separate from the substrate 100, and under the action of external mechanical tension, a film layer contacting the encapsulating film layer covering the hollow portion 10, such as the flexible substrate 200 and the film layer 300 constituting the thin film transistor, may be degraded (e.g., bent, ripped, cracked, warped, etc.), resulting in low production yield, affecting the development of stretch display devices.

According to the embodiment of the present disclosure, by providing the thermal separation material in the hollow portion of the film layer and the flexible substrate for forming the thin film transistor, on the one hand, direct contact between the encapsulating film layer and the substrate can be avoided, and on the other hand, separation of the thermal separation material and the substrate is improved. Additionally the encapsulating film layer is blocked from contacting the flexible substrate and the portions of the film layer facing the hollow portion. In one example, the encapsulating film layer is blocked from entering the hollow portions. After the stretch display device is prepared on the substrate, the thermal separation material can be heated, thereby facilitating peeling off the substrate, completing the preparation of the stretch display device, and significantly improving the production yield of the stretch display device compared to the previous example illustrated in FIG. 2.

According to an embodiment of the disclosure illustrated in the example of FIG. 1, a method begins at S100, which includes providing a substrate, and providing a flexible substrate on the substrate.

According to an embodiment of the present disclosure, in this step, a substrate is provided, and a flexible substrate is disposed on the substrate. According to an embodiment of the present disclosure, a rigid substrate is provided. In one example, the substrate is a first substrate that is rigid and less flexible than a second substrate applied thereto, wherein the second substrate is flexible relative to the first substrate. Specifically, the substrate may be a glass substrate, which can function as a supporting substrate for the preparation and facilitation of a stretch display device, and facilitates the preparation of the stretched display device The specific material of the flexible substrate is not particularly limited as long as it has some amount of flexibility, and those skilled in the art can modify its flexibility according to specific conditions. For example, in accordance with a particular embodiment of the disclosure, the flexible substrate can be constructed of polyimide (PI).

The method proceeds to S200, which comprises providing a film layer for forming a thin film transistor on a side of the flexible substrate away from the substrate.

According to an embodiment of the present disclosure, in this step, a film layer for constituting a thin film transistor is disposed on a side of the flexible substrate away from the substrate. According to an embodiment of the present disclosure, a side of the film layer constituting the thin film transistor away from the flexible substrate defines a plurality of pixel regions for subsequent steps in which the light emitting elements are disposed. In one example, the film layer is arranged onto the flexible substrate such that the flexible substrate is sandwiched between the film layer and the substrate.

The specific structure of the film layer for constituting the thin film transistor is not particularly limited, and those skilled in the art can design according to the requirements of a specific product. For example, referring to FIG. 3, the film layer 300 for constituting a thin film transistor may include a buffer layer 310, a gate insulating layer 320, an interlayer dielectric layer 330, and an insulating layer 340 which are sequentially stacked. The buffer layer 310 is disposed adjacent to the flexible substrate 200, followed by the gate insulating layer 320, the interlayer dielectric layer 330, and the insulating layer 340, wherein the insulating layer 340 is most distal to the flexible substrate 200.

The sequentially stacked layers may be described with regard to axes of an axis system comprising an x-axis parallel to a horizontal direction, a y-axis parallel to a vertical direction, and a z-axis perpendicular to each of the x- and y-axes. In one example, a thickness of the layers may be measured along the y-axis and a width of the layers may be measured along the x-axis.

Returning to FIG. 2, the method proceeds to S300, which comprises forming a hollow portion between two adjacent pixel regions According to an embodiment of the disclosure, in this step, a hollow portion is formed between two adjacent pixel regions. According to an embodiment of the present disclosure, the hollow portion penetrates through the film layer for forming the thin film transistor and the flexible substrate, thereby facilitating the realization of the stretch display. The specific process for forming the hollow portion is not particularly limited, and those skilled in the art can design according to the specific situation. According to an embodiment of the present disclosure, a film layer constituting a thin film transistor and a region of the flexible substrate other than the hollow portion are connected. The hollow portion may be shaped such that each of the film layer, the flexible substrate, and the rigid substrate comprise a surface exposed to the hollow portion.

According to an embodiment of the present disclosure, after the thin film portion is formed in the film layer, the method may further include setting a pixel on a side of the film layer for constituting the thin film transistor away from the flexible substrate via a pixel defining structure. The pixel defining structure defines a plurality of pixel regions, and a package partition wall is disposed on a side of the pixel defining structure adjacent to the hollow portion. Specifically, referring to (a) of FIG. 3, a side of the film layer 300 constituting the thin film transistor away from the flexible substrate 200 is provided with a pixel defining structure 20, and the plurality of pixel defining structures 20 define a plurality of pixel regions 40 (a dotted line region is shown in the figure illustrating an example of a pixel region of the plurality of pixel regions 40), and a side of the pixel defining structure 20 adjacent to the hollow portion 10 is provided with a package partition wall 30. Therefore, the pixel defining structure can be used to separate the plurality of light-emitting elements that are subsequently disposed to prevent cross-coloring, and the package partition wall can be used to block the subsequently disposed encapsulating film layer covering the thermal separation material and the encapsulating film layer covering the light-emitting component, and ensure after the thermal separation material is removed, the remaining encapsulating film layer can still seal the luminescent element without releasing therefrom.

According to an embodiment of the present disclosure, reference is made to FIG. 4 which shows a top view of (a) of FIG. 3, with a hollow portion 10 between two adjacent pixel regions 40, and a substrate below the hollow portion 10 (not shown). The film layer constituting the thin film transistor and the flexible substrate (not shown) other than the hollow portion 10 are connected, thereby facilitating the stretch display device to realize the stretch display. According to the embodiment of the present disclosure, the package partition wall 30 is disposed around the pixel region 40, and the side wall of the package partition wall 30 near the hollow portion 10 is inclined toward the side away from the hollow portion 10, and is packaged when the package film layer is subsequently disposed. The film layer is less likely to form a continuous structure at the side walls, so that the encapsulating film layer covering the hollow portion is disconnected from the encapsulating film layer covering the remaining regions at the side walls. That is to say, only the encapsulating film layer coupled to the thermal separation material may be removed.

The shape of the longitudinal section of the package partition wall is not particularly limited as long as the side wall of the package partition wall near the hollow portion is inclined toward the side proximate to the pixel region. For example, according to an embodiment of the present disclosure, the partition wall 30 is encapsulated. The longitudinal section may have an inverted trapezoidal shape, whereby when the encapsulating film layer is subsequently disposed, the encapsulating film layer of the hollow portion and the encapsulating film layer of the remaining region may be partitioned by the encapsulating partition wall.

It can be understood by those skilled in the art that the pixel defining structure is also desired to be separated between the light emitting elements in the non-stretch display device to prevent cross-coloring, but since there is no partition of the hollow portion, between the adjacent two light-emitting elements The pixel delimiting structure is a shared pixel delimiting structure. According to an embodiment of the present disclosure, the stretch display device has a hollow portion between two adjacent pixel regions, and therefore, the pixel defining structure of each pixel region is not shared with adjacent pixel regions to define different pixel regions.

Figure 2:
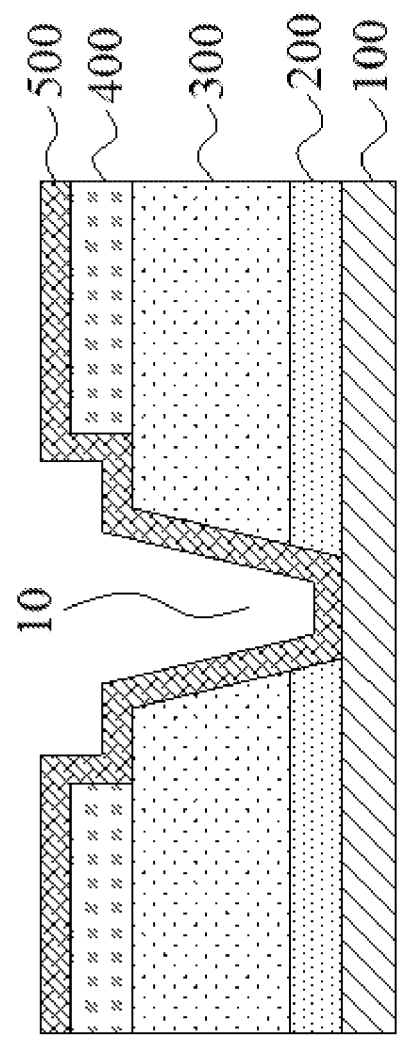
FIG. 2 shows a schematic view showing the structure of a stretch display device shown in previous example prior to separating the rigid substrate from the stretch display devices.

Returning to the method of FIG. 2, following S300, the method proceeds to S400 which includes setting the thermal separation material in the hollow portion.

According to an embodiment of the disclosure, in this step, a thermal separation material is provided in the hollow portion. According to an embodiment of the present disclosure, the manner of providing the thermal separation material may include at least one of printing and coating. Thereby, the setting of the thermal separation material can be achieved in a cost-effective and efficient manner.

According to an embodiment of the present disclosure, the thermal separation material may be an organic foaming material, whereby when the thermal separation material is heated following a duration after being placed in the hollow portion. The thermal separation material can generate gas after being heated, thereby realizing a separation between the thermal separation material and other structures, such as the substrate which is physically coupled to (e.g., adhered to) the thermal separation material. According to a particular embodiment of the disclosure, the thermal separation material may comprise at least one of azodicarbonamide, diazoaminobenzene, and p-toluenesulfonylhydrazide. The above materials can generate nitrogen under heating conditions, thereby facilitating separation of the thermal separation material from the encapsulating film layer covering the thermal separation material and the substrate. Furthermore, the above materials may comprise adhesive qualities up to a specific temperature where it can then be separated from that to which it is bound.

The thermal separation material may be an adhesive, such as a glue in one example. Additionally or alternatively, the thermal separation material may be one or more of a cream, powder, spray, coating, gel, and the like. The thermal separation material may exhibit adhesive qualities at specific temperature ranges. As one example, the thermal separation material/glue may act as an adhesive within a first temperature range and allow for separation at temperatures greater than the first temperature range.

According to an embodiment of the present disclosure, the thickness of the thermal separation material is not particularly limited as long as the top of the thermal separation material (the side of the thermal separation material away from the substrate) is lower than the top of the package partition wall (the side of the partition wall away from the membrane layer). The thickness may be further based on its ability to block the encapsulating film layer from coming into contact with the underlying substrate. For example, the side of the thermal separation material away from the substrate may be lower than the side of the film layer away from the substrate. Alternatively, referring to (b) of FIG. 3, the side of the thermal separation material 600 away from the substrate 100 may also be flush with the side of the film layer 300 remote from the substrate 100. Alternatively, the side of the thermal separation material away from the substrate may be higher than the side of the film layer away from the substrate and lower than the side of the package partition wall away from the substrate. Therefore, when the encapsulating film layer is provided following the thermal separation material being arranged in the hollow portion, the encapsulating film layer corresponding to the hollow portion can be blocked from coming into contact with the substrate, the flexible substrate, and the film layer, thereby alleviating the problem of the flexible substrate and the film layer constituting the thin film transistor, and increasing the production yield.

The thickness of the package partition wall may be about 2 μm in the previous examples of the stretch display device.

According to an embodiment of the present disclosure, when a stretch display device is provided with a package partition wall, the thermal separation material is higher than a thickness of a film portion constituting the thin film transistor by less than 2 µm, and two layers are provided in the stretch display device. When the partition wall is packaged, the thermal separation material is higher than the thickness of the film portion constituting the thin film transistor by less than 4 µm. That is to say, a difference in thickness between the thermal separation material and the film portion is less than 4 µm.

According to an embodiment of the present disclosure, the thermal separation material may have a thickness of 1 to 50 µm. Thus, by providing the thermal separation material in the hollow portion, the issue of the flexible substrate and the film layer for forming the thin film transistor binding to the encapsulating material can be alleviated when the substrate is peeled off, the production yield is improved. Additionally or alternatively, when the thermal separation material is flush with the thin film transistor or higher than the film layer forming the thin film transistor and lower than the package partition wall, the heating of the thermal separation material can be adjusted to produce a desired amount of gas. The thickness of the separation material may be proportional to the thickness of the film layer. That is to say, when the film layer for constituting the thin film transistor is large or thick, the thickness of the thermal separation material is also relatively large. In this way, the thickness of the thermal separation material is at least as thick as the film layer. Additionally or alternatively, the thickness of the thermal separation material is at least as thick as a combined thickness of the thicknesses of the film layer and the flexible substrate. The combined thickness may be between 1 to 50 µm. Furthermore, the thicknesses of the film layer and the flexible substrate may be equal. Additionally or alternatively, the thickness of the film layer may be greater than or less than the thickness of the flexible substrate.

Returning to FIG. 1, the method proceeds to S500, following S400, which includes disposing a light-emitting element in a pixel region, and providing an encapsulating film layer on a side of the light-emitting element and the thermal separation material away from the flexible substrate According to an embodiment of the present disclosure, a light-emitting element is disposed in a pixel region, and an encapsulating film layer is disposed on a side of the light-emitting element and the thermal separation material away from the flexible substrate. According to an embodiment of the present disclosure, a light-emitting element is disposed in a pixel region, that is, a light-emitting element is disposed between two adjacent pixel-defining structures, and the light-emitting element may be an organic electroluminescence element. Specifically, referring to (c) of FIG. 3, the light emitting elements 400 are disposed between the pixel defining structures 20. According to an embodiment of the present disclosure, the preparation of the light-emitting layer in the light-emitting element can be accomplished by evaporation (e.g., steaming).

It should be noted that the temperature of the vapor-deposited luminescent material may be less than 50° C., and the temperature of the subsequent heating of the thermal separation material is between 60 and 120° C. Therefore, the thermal separation material is not affected when the luminescent element is prepared.

According to an embodiment of the present disclosure, a drain of a thin film transistor is disposed in an insulating layer constituting a thin film transistor, and an anode of the light emitting element is connected to a drain of the thin film transistor (not shown) to realize light emission of the thin film transistor component control.

According to an embodiment of the present disclosure, after the light-emitting element is prepared, an encapsulating film layer 500 is disposed on a side of the light-emitting element 400 and the thermal separation material 600 away from the substrate. Specifically, referring to (c) of FIG. 3, the encapsulating film layer 500 covers the pixel defining structure 20, the light emitting element 400, the package partition wall 30, and the thermal separation material 600.

According to the embodiment of the present disclosure, when the thickness of the encapsulating film layer 500 is thin, since the height of the thermal separation material 600 disposed in front is lower than that of the package partition wall 30, and the package partition wall 30 is a trapezoidal structure, the encapsulating film layer 500 is disposed. In other embodiments the trapezoidal structure may be inverted. In the process, the encapsulated partition wall can directly disconnect the encapsulating film layer of the hollow portion from the encapsulating film layer of the remaining region: the side wall of the packaging partition wall adjacent to the thermal separation material side is a side wall inclined to one side of the packaging partition wall, and the package. The material of the film layer does not easily form a continuous film layer at the side wall, and thus can be broken between the package partition wall and the thermal separation material while ensuring the continuity of the encapsulating film layer of the remaining region (pixel region). When the thickness of the encapsulating film layer is thick, the encapsulating film layer is also disposed at the sidewall of the package partition wall, but since the package partition wall is an inverted trapezoidal structure, the encapsulating film layer at the sidewall is poor in continuity and has a gap. The encapsulating film layer at the side walls can also be broken by a simple subsequent process.

Returning to FIG. 1, the method proceeds to S600, following S500, which includes heating the thermal separation material and peeling off the flexible substrate and the substrate.

According to an embodiment of the present disclosure, the thermal separation material is heated and the flexible substrate and the substrate are peeled off. According to an embodiment of the disclosure, the temperature of the thermal separation material may be heated to a temperature from 60 to 120° C. The above temperature range facilitates separation of the thermal separation material from a portion the encapsulating film layer covering the thermal separation material, while the temperatures within the range do not affect the performance of the light-emitting element. More specifically, the temperature range of the thermal separation material is desired to be greater than a preparation temperature of the vapor-deposited luminescent material and less than a temperature than may degrade operation of the light-emitting element.

According to an embodiment of the present disclosure, after the thermally separation material is heated, the thermally separation material generates a gas, so that the thermally separation material separates from the encapsulating film layer covering the thermally separation material and the substrate, thereby facilitating peeling off of the substrate.

According to an embodiment of the present disclosure, after the thermal separation material is heated, the thermal separation material and the encapsulating film layer covering the thermal separation material and the substrate are separated, and the order of subsequently peeling off the substrate and removing the thermal separation material is not limited. For example, the substrate may be peeled off from the flexible substrate, and the thermal separation material may be removed to obtain a stretch display device (as shown in (d) of FIG. 3). Alternatively, the thermal separation material may be removed first, and then the substrate may be peeled off to obtain the stretch display device (as shown in (d) of FIG. 3). The above method can alleviate the problem of the flexible substrate and the film layer for forming the thin film transistor, and has high production yield.

According to an embodiment of the present disclosure, the removal of the thermal separation material may be achieved by first breaking the encapsulating film layer covering the thermal separation material from the encapsulating film layer covering the remaining regions, and then, overturning the entire device to remove the thermal separation material. Thus, the thermal separation material can be removed by a simple method to obtain a stretch display device. According to an embodiment of the disclosure, the encapsulating film layer covering the thermal separation material is disconnected from the encapsulating film layer covering the remaining regions, which may include the package partition wall 30, the light-emitting element 400, and the pixel defining structure 20.

According to an embodiment of the present disclosure, when the thermal separation material is lower than the film layer 300 for constituting the thin film transistor, the encapsulating film layer 500 at the hollow portion is in contact with the film layer 300 for constituting the thin film transistor, and therefore, it is necessary to increase the process to open the hollow portion. The encapsulating film layer is disconnected from the film layer constituting the thin film transistor such that the encapsulating film layer covering the thermal separation material is disconnected from the encapsulating film layer covering the remaining regions. According to an embodiment of the present disclosure, the encapsulating film layer is disconnected from the film layer for constituting the thin film transistor, which can be realized by a laser process.

According to an embodiment of the present disclosure, when the side of the thermal separation material away from the substrate is flush with the side of the film layer constituting the thin film transistor away from the substrate, the encapsulating film layer at the hollow portion is directly disposed on the thermal separation material. It does not come into contact with the film layer for forming the thin film transistor. When the package film layer is thin, the package film layer covering the thermal separation material can be directly disconnected from the encapsulating film layer covering the remaining area by the package partition wall. When the film layer is thick, the encapsulating film layer covering the thermal separation material can be disconnected from the encapsulating film layer covering the remaining area by heating the thermal separation material. When the encapsulating film layer is thick, the package at the side wall of the packaging partition wall may still be directly disconnected from the encapsulating film layer covering the remaining area by the package partition wall. The film layer has a gap, and the gap is continuously increased when the thermal separation material is heated, so that the encapsulating film layer is disconnected from the side wall of the packaging partition wall, thereby breaking the hollow portion encapsulating film layer and the remaining region encapsulating film layer.

According to an embodiment of the present disclosure, when the side of the thermal separation material is away from the substrate, higher than the side of the film layer constituting the thin film transistor from the substrate, and lower than the side of the package partition wall away from the substrate, at the hollow portion The encapsulating film layer is directly disposed on the thermal separation material and does not contact the film layer for forming the thin film transistor. When the encapsulating film layer is thin, the encapsulating film layer covering the thermal separation material can be directly covered by the package partition wall. The encapsulating film layer of the remaining area is broken. When the encapsulating film layer is thick, the encapsulating film layer covering the thermal separation material can be disconnected from the encapsulating film layer covering the remaining area by heating the thermal separation material.

In another aspect of the disclosure, the disclosure provides a stretch display device. According to an embodiment of the present disclosure, the stretch display device is prepared according to the method described above, whereby the stretch display device has all the features and advantages of the stretch display device prepared by the method described above, and details are not described herein again. In general, the stretch display device has a high production yield.

Figure 5:
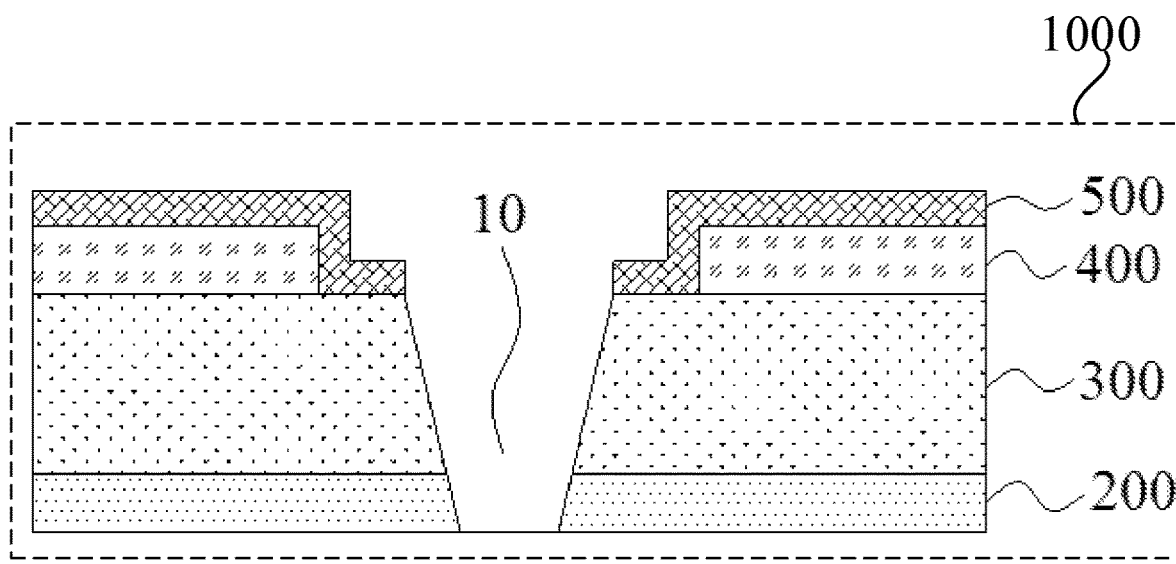
FIG. 5 shows a view showing the structure of a stretch display device in accordance with one embodiment of the present disclosure.

In another aspect of the disclosure, the disclosure provides a stretch display device. According to an embodiment of the present disclosure, referring to FIG. 5, the stretch display device 1000 includes a flexible substrate 200 sequentially stacked, a film layer 300 for constituting a thin film transistor, a light emitting element 400, and a encapsulating film layer 500. There is a hollow portion 10 between the two adjacent light-emitting elements 400. The hollow portion 10 penetrates through the film layer 300 for forming a thin film transistor and the flexible substrate 200. The package film layer 500 covers the light-emitting element 400 and does not cover the hollow portion 10. Thus, the stretch display device has a high production yield.

According to an embodiment of the present disclosure, the stretch display device may be a stretch display device prepared by the method described above, whereby the stretch display device has the same features as the stretch display device prepared by the method described above and Advantages will not be described here.

Figure 3:
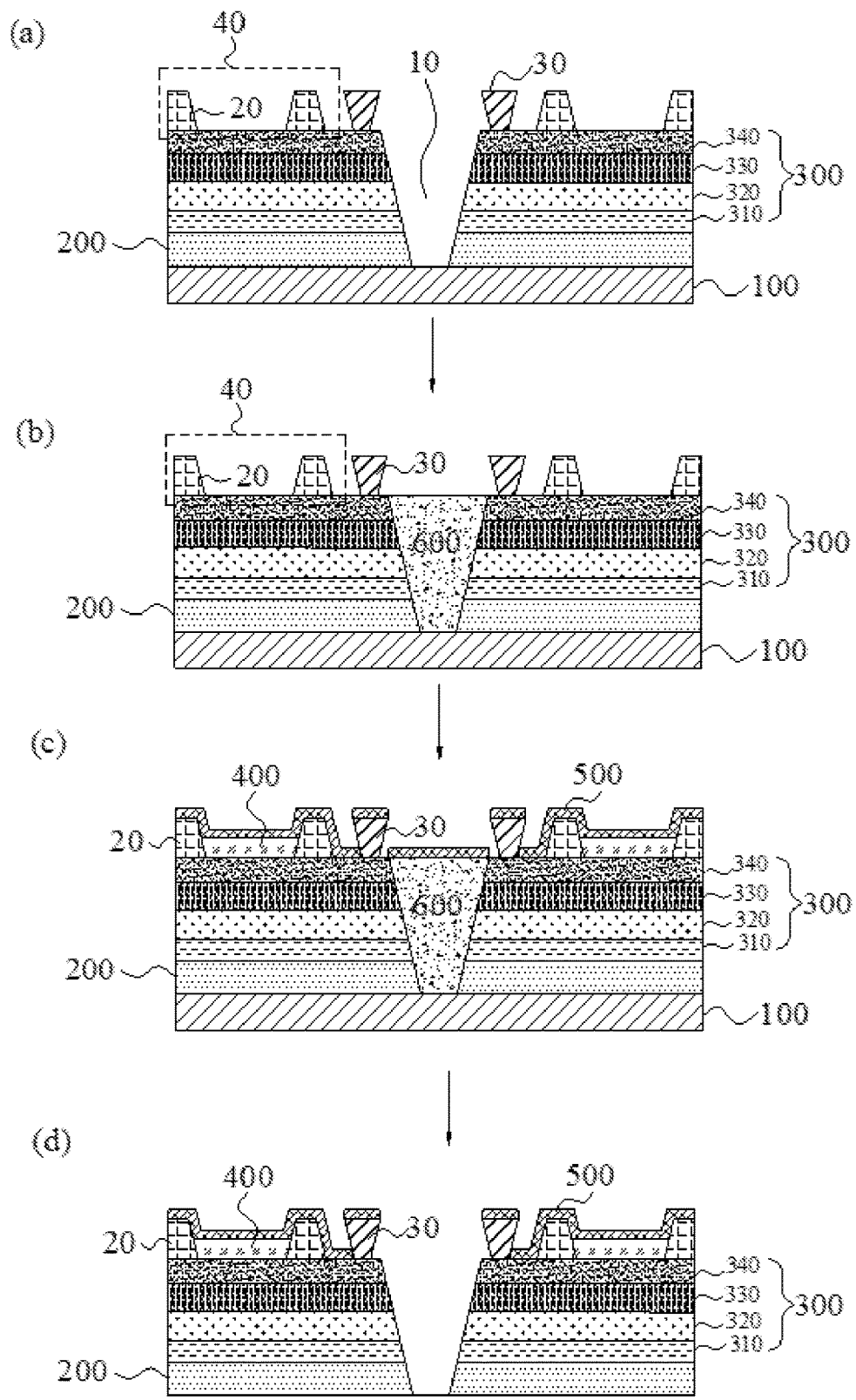
FIG. 3 shows a transition of a starting material to a stretch display device as the stretch display device is manufactured.
Figure 4:
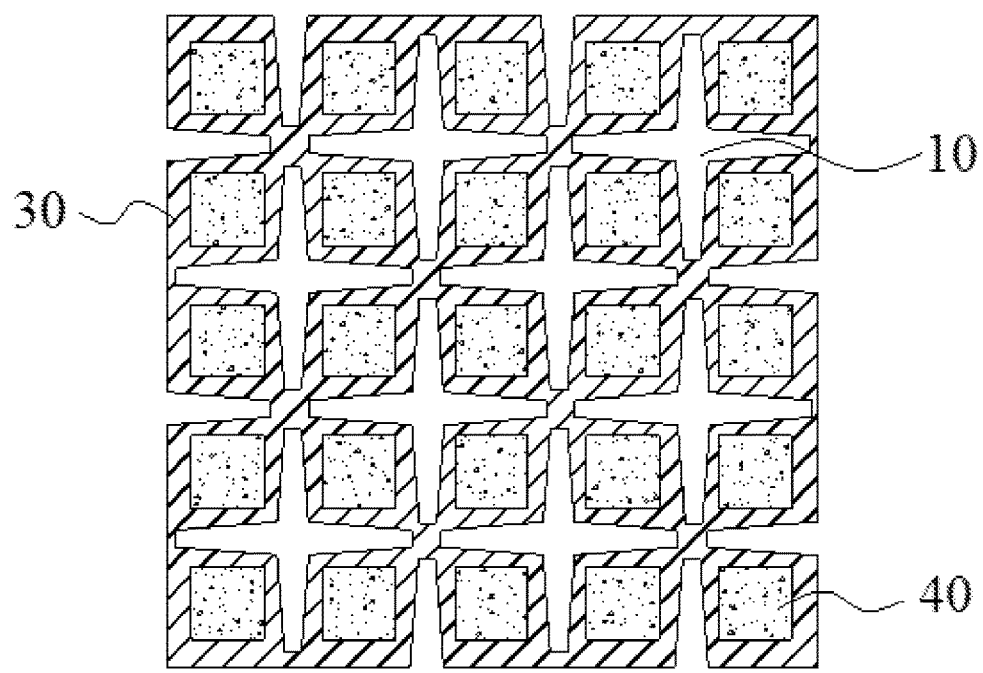
FIG. 4 shows a top view a first embodiment illustrated in FIG. 3.

According to an embodiment of the present disclosure, referring to (d) of FIG. 3, the stretch display device may further include a pixel defining structure 20, a package partition wall 30, and the pixel defining structure 20 and the package partition wall 30 are both located for forming a thin film transistor. The film layer 300 is away from one side of the flexible substrate 200, and the pixel defining structure 20 defines a plurality of pixel regions, the light emitting element 400 is disposed between adjacent two pixel defining structures 20, and each of the light emitting elements 400 has two of the pixel defining structure 20, one of the package partition wall 30 is located on a side of the pixel defining structure 20 near the hollow portion, and the longitudinal section of the packaging partition wall 30 may be a trapezoid. Therefore, the pixel defining structure can block cross-coloring of the light-emitting elements, and the package partition wall can be used to partition the encapsulating film layer of the hollow portion and the encapsulating film layer of the remaining region in the process of preparing the stretch display device.

FIGS. 1-5 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

In this way, a stretch display device may be manufactured with a high-yield via the incorporation of a thermal separation material. In one example, the thermal separation material may block direct contact between an encapsulating film layer and a rigid substrate, which may alleviate issues associated with mechanical tension during removal of the rigid substrate. The thermal separation material may be filled in a hollow region arranged between adjacent pixel regions of a film layer. The thermal separation material may be applied via printing, coating, and the like. Once the thermal separation material is arranged in the hollow region, the light-emitting element may be heated to a temperature less than a gassing temperature of the thermal separation material. In one example, the light-emitting element is steamed to a temperature less than or equal to 50° C.

Once the plating and the encapsulating filum layer are set, the thermal separation material may be heated such that it decomposes. In one example, the thermal separation material is one or more of azodicarbonamide (ADC), diazoaminobenzene (DAB), and p-toluenesulfonylhydrazide (TSH), each of which may be configured to decompose at temperatures greater than a preparation temperature of the light-emitting element and less than a temperature that may result in degradation of the light-emitting element. As such, the thermal separation material may decompose at a temperature between 60 to 120° C.

Heating the thermal separation material may result in removal of the thermal separation material and a portion of the encapsulating film layer directly coupled to only the thermal separation material. As such, other portions of the encapsulating film layer are not removed from the stretch display device. Once the thermal separation material and the portion of the encapsulating film layer are removed, the substrate (e.g., the rigid substrate) may be removed from the stretch display device via laser peeling or similar method. As such, the mechanical tension generated during the separation of the stretch display device from the rigid substrate may not degrade the encapsulating film layer, the film layer, the flexible substrate, or other portions of the stretch display device.

The technical effect of using the thermal separation material is to facilitate the removal of the stretch display device from a rigid substrate. The thermal separation material may stretch a hollow portion of arranged between adjacent pixel regions, which may allow easier separation of the stretch display device from the rigid substrate compared to previous manufacturing methods of the stretch display device.

The specific structure of the film layer constituting the thin film transistor has been described in detail above and will not be described herein.

In the description of the present disclosure, the orientation or positional relationship of the terms "upper", "lower" and the like is based on the orientation or positional relationship shown in the drawings, and is merely for the convenience of describing the present disclosure and does not require that the disclosure must be specific. Azimuth construction and operation are therefore not to be construed as limiting the disclosure.

In the description of the present specification, the description of the terms "one embodiment", "another embodiment" or the like means that the specific features, structures, materials or characteristics described in connection with the embodiments are included in at least one embodiment of the present disclosure. In the present specification, the schematic representation of the above terms is not necessarily directed to the same embodiment or example. Furthermore, the particular features, structures, materials, or characteristics described may be combined in a suitable manner in any one or more embodiments or examples. In addition, various embodiments or examples described in the specification, as well as features of various embodiments or examples, may be combined and combined. In addition, it should be noted that in the present specification, the terms "first" and "second" are used for descriptive purposes only, and are not to be construed as indicating or implying a relative importance or implicitly indicating the number of technical features indicated.

Although the embodiments of the present disclosure have been shown and described, it is understood that the above-described embodiments are illustrative and are not to be construed as limiting the scope of the disclosure. The embodiments are subject to variations, modifications, substitutions and variations.

The invention claimed is:

1. A method of preparing a stretch display device, comprising:
   providing a substrate on which a flexible substrate is disposed;
   providing a film layer for forming a thin film transistor on a side of the flexible substrate away from the substrate, the film layer defining a plurality of pixel regions away from the side of the flexible substrate;
   forming a hollow portion between two adjacent pixel regions, the hollow portion penetrating the film layer and the flexible substrate;
   providing a thermal separation glue in the hollow portion;
   providing a light-emitting element in each pixel region of the plurality of pixel regions, and providing an encapsulating film layer on a side of the light-emitting element and the thermal separation glue away from the flexible substrate; and
   heating the thermal separation glue and stripping the flexible substrate and the substrate.

2. The method of claim 1, wherein after the hollow portion is formed between two adjacent of the pixel regions, and before the thermal separation glue is disposed in the hollow portion, the method further comprises:

providing a pixel defining structure on a side of the film layer away from the flexible substrate, the pixel defining structure defining the plurality of pixel regions, wherein a package partition wall is disposed on a side of the pixel defining structure adjacent to the hollow portion.

3. The method of claim 2, wherein the thermal separation glue is away from a side of the substrate and is flush with a side of the film layer away from the substrate.

4. The method of claim 2, wherein said thermal separation glue is remote from one side of said substrate above said film layer and below said package partition wall.

5. The method of claim 1, wherein the film layer comprises a buffer layer, a gate insulating layer, an interlayer dielectric layer, and an insulating layer which are sequentially stacked, wherein the buffer layer is adjacent to the flexible substrate.

6. The method of claim 1, wherein the thermal separation glue has a thickness of from 1 to 50 μm.

7. The method of claim 1, wherein providing the thermal separation glue comprises at least one of printing and coating.

8. The method of claim 1, wherein heating the thermal separation glue comprises heating the thermal separation glue to a temperature between 60 and 120° C.

9. The method of claim 8, wherein the thermal separation glue comprises at least one of azodicarbonamide, diazoaminobenzene, and p-toluenesulfonylhydrazide.

10. The method of claim 1, wherein after the thermal separation glue is heated, and before the substrate is peeled off, the method further comprises:

removing the thermal separation glue and the encapsulating film layer covering the thermal separation glue.

11. The method of claim 10, wherein the removing the thermal separation glue and the encapsulating film layer covering the thermal separation glue comprises:

heating the thermal separation glue to break the encapsulating film layer covering the thermal separation glue from the encapsulating film layer covering remaining regions; and inverting the flexible substrate provided with the thermal separation glue to take out the thermal separation glue.

12. The method of claim 1, wherein after the substrate is peeled off, the method further comprises:

removing the thermal separation glue and the encapsulating film layer covering the thermal separation glue.

13. The method of claim 12, wherein the removing the thermal separation glue and the encapsulating film layer covering the thermal separation glue comprises:

heating the thermal separation glue to break the encapsulating film layer covering the thermal separation glue from the encapsulating film layer covering remaining regions; and inverting the flexible substrate provided with the thermal separation glue to take out the thermal separation glue.

* * * * *